US009472728B2

(12) United States Patent
Jung et al.

(10) Patent No.: US 9,472,728 B2

(45) Date of Patent: Oct. 18, 2016

(54) LIGHT EMITTING DEVICE PACKAGE AND LIGHTING APPARATUS INCLUDING THE PACKAGE

(71) Applicant: LG INNOTEK CO., LTD., Seoul (KR)

(72) Inventors: Kyeoung An Jung, Seoul (KR); Jung Hun Oh, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 121 days.

(21) Appl. No.: 14/482,466

(22) Filed: Sep. 10, 2014

(65) Prior Publication Data

US 2015/0070909 A1 Mar. 12, 2015

(30) Foreign Application Priority Data

Sep. 11, 2013 (KR) ........................ 10-2013-0108963

(51) Int. Cl.

| | |
|---|---|
| ***H01L 33/48*** | (2010.01) |
| ***F21V 3/00*** | (2015.01) |
| ***F21V 29/00*** | (2015.01) |
| ***F21V 3/04*** | (2006.01) |
| ***H01L 33/54*** | (2010.01) |

(Continued)

(52) U.S. Cl.

CPC ................ *H01L 33/48* (2013.01); *F21V 3/00* (2013.01); *F21V 3/0472* (2013.01); *F21V 29/22* (2013.01); *H01L 33/486* (2013.01); *H01L 33/54* (2013.01); *F21Y 2101/02* (2013.01); *H01L 33/62* (2013.01); *H01L 2224/48091* (2013.01); *H01L 2224/48247* (2013.01); *H01L 2224/48257* (2013.01); *H01L 2224/49107* (2013.01); *H01L 2224/73265* (2013.01)

(58) Field of Classification Search

CPC ..... H01L 33/48; H01L 33/486; H01L 33/54; H01L 33/62; H01L 2224/48091; H01L 2224/48247; H01L 2224/48257; H01L 2224/48107; H01L 2224/73265; F21V 3/00; F21V 29/22; F21V 3/0472; F21Y 2101/02

USPC ........................................ 362/311.02, 249.02

See application file for complete search history.

(56) References Cited

U.S. PATENT DOCUMENTS

2008/0122123 A1 5/2008 Pang
2010/0006877 A1 1/2010 Chen et al.

(Continued)

FOREIGN PATENT DOCUMENTS

DE 10 2011 115 150 A1 3/2013
EP 2 282 354 A1 2/2011

(Continued)

OTHER PUBLICATIONS

European Search Report dated Feb. 11, 2015 issued in Application No. 14179994.0.

(Continued)

*Primary Examiner* — Laura Tso

(74) *Attorney, Agent, or Firm* — KED & Associates, LLP

(57) ABSTRACT

A light emitting device package includes a package body, and a light emitting device chip provided on a chip mount area of the package body. A molding member is provided on the package body. The package body includes a central area having the chip mount area and a chip non-mount area adjacent to the chip mount area. An upper surface of the light emitting device chip is higher than an upper surface of the package body in the chip non-mount area and an upper surface of the package body in the peripheral area.

20 Claims, 16 Drawing Sheets

(51) Int. Cl.
*F21Y 101/02* (2006.01)
*H01L 33/62* (2010.01)

(56) References Cited

U.S. PATENT DOCUMENTS

2011/0309404 A1 12/2011 Lee
2013/0070479 A1* 3/2013 Ito ........................ G02B 6/0031 362/609
2014/0085884 A1* 3/2014 Horio .................. H01L 25/0753 362/235

FOREIGN PATENT DOCUMENTS

WO WO 2013/019032 A1 2/2013
WO WO 2013/088790 A2 6/2013

OTHER PUBLICATIONS

European Search Report dated Jan. 19, 2016 issued in Application No. 14179994.0.

* cited by examiner

--Related Art--

LIGHT EMITTING DEVICE PACKAGE AND LIGHTING APPARATUS INCLUDING THE PACKAGE

CROSS-REFERENCE TO RELATED APPLICATION

This application claims priority under 35 U.S.C. §119 to Korean Application No. 10-2013-0108963 filed on Sep. 11, 2013, whose entire disclosure is hereby incorporated by reference.

BACKGROUND

1. Field

Embodiments relate to a light emitting device package and a lighting apparatus including the package.

2. Background

Light emitting diodes (LEDs) are semiconductor devices which send and receive a signal by converting electricity into infrared light or visible light using characteristics of compound semiconductors or are used as light sources. Group III-V nitride semiconductors receive favorable attention as essential materials for light emitting devices such as light emitting diodes (LEDs) or laser diodes (LDs) due to physical and chemical properties thereof.

Such a light emitting diode (LED) does not contain environmentally harmful substances such as mercury (Hg) used in lighting apparatuses such as incandescent lamps or fluorescent lamps. Such an LED has superior eco-friendliness, long lifespan and low power consumption, and is used as alternatives of conventional light sources.

FIG. 1 is a sectional view showing a background light emitting device package. The light emitting device package includes package bodies 10A and 10B electrically separated from each other by an insulative material 20, a light emitting device chip 30, a submount 40, wires 50A and 50B, and a molding part 60.

The package bodies 10A and 10B define a cavity. The light emitting device chip 30 is disposed on the package body 10A in the cavity. In a case in which the light emitting device chip 30 is disposed in the cavity as described above, a portion of light emitted from the light emitting device chip 30 is captured in the cavity, whereby an amount of light is reduced. Furthermore, when high current of, for example 20 mA is supplied to the light emitting device chip 30, the molding part 60 may be broken.

In addition, since the light emitting device chip 30 is captured in the cavity, light exits only in a vertical direction 5. As a result, it is difficult to satisfy various demands of consumers.

The above references are incorporated by reference herein where appropriate for appropriate teachings of additional or alternative details, features and/or technical background.

BRIEF DESCRIPTION OF THE DRAWINGS

Arrangements and embodiments may be described in detail with reference to the following drawings in which like reference numerals refer to like elements and wherein.

DETAILED DESCRIPTION

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

Meanwhile, relational terms, such as 'first' and 'second' and 'upper part' and 'lower part', are used only to distinguish between one subject or element and another subject and element without necessarily requiring or involving any physical or logical relationship or sequence between such subjects or elements.

Figure 2:
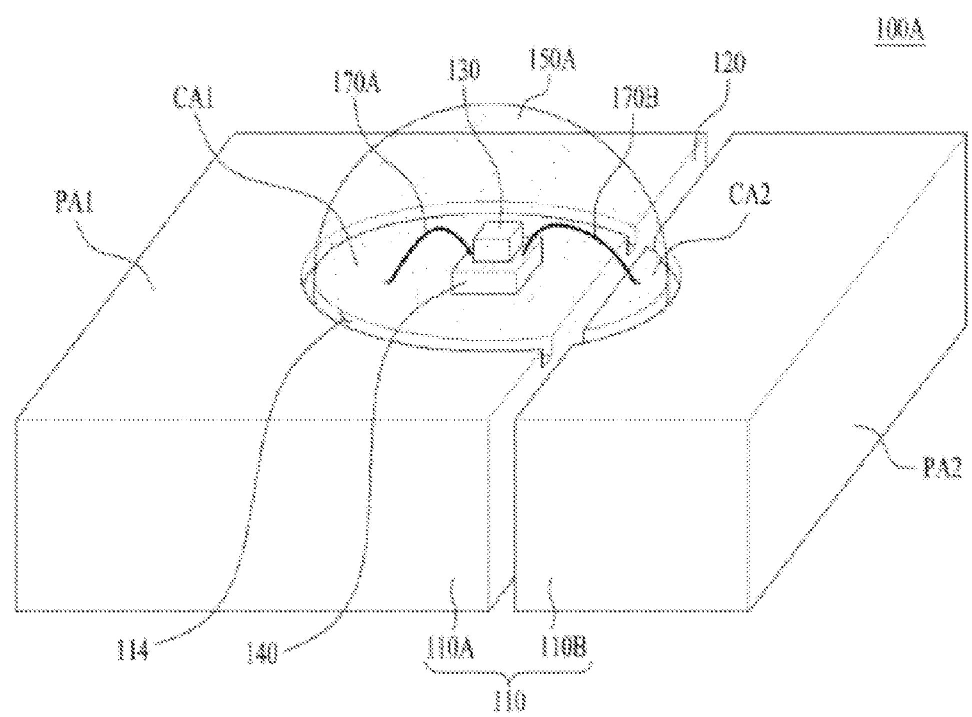
FIG. 2 is a perspective view showing a light emitting device package according to an embodiment.
Figure 3:
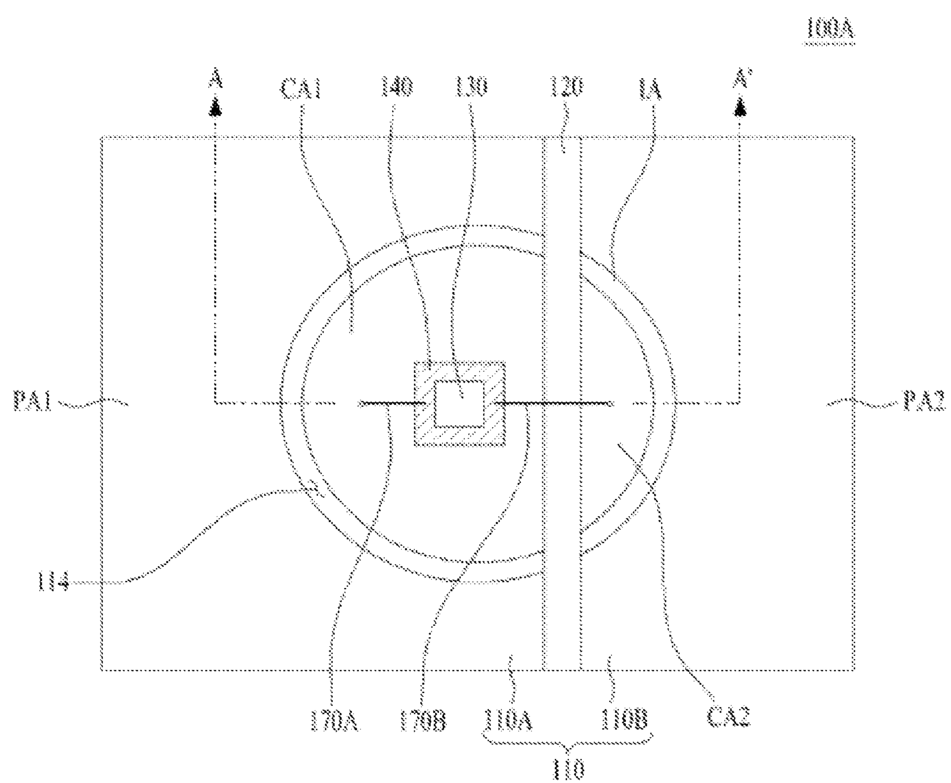
FIG. 3 is a plan view of the light emitting device package shown in FIG. 2.
Figure 4:
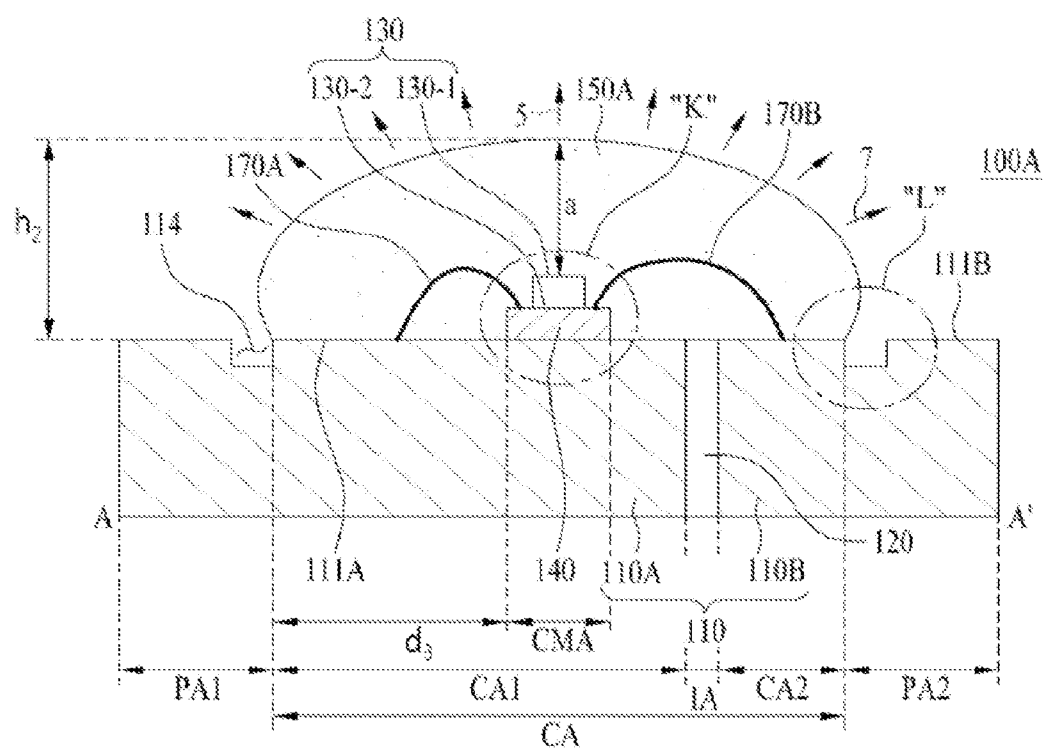
FIG. 4 is a sectional view taken along line A-A' of FIG. 3.

FIG. 2 is a perspective view showing a light emitting device package 100A according to an embodiment, FIG. 3 is a plan view of the light emitting device package 100A shown in FIG. 2, and FIG. 4 is a sectional view taken along line A-A' of FIG. 3. For the convenience of description, an insulation part 120 is omitted from FIG. 2 and a molding member 150A is omitted from FIG. 3.

Referring to FIGS. 2 to 4, the light emitting device package 100A includes a package body 110, an insulation part 120, a light emitting device chip 130, a submount 140, a molding member 150A, and wires 170A and 170B. The package body 110 includes a first body 110A and a second body 110B, which are electrically separated from each other by the insulation part 120. In addition, the package body 110 may be divided into a central area CA and a peripheral area PA1 and PA2.

The central area CA is defined as an area in which the light emitting device chip 130 and the molding member 150A are disposed. The central area CA may be divided into a first central segment CA1, a second central segment CA2, and an insulation segment IA. The first central segment CA1 corresponds to a portion of the central area CA in which the first body 110A is disposed. The second central segment CA2 corresponds to a portion of the central area CA in which the second body 110B is disposed. The insulation segment IA corresponds to a portion of the central area CA in which the insulation part 120 is disposed.

The first or second central segment CA1 or CA2 may be divided into a chip mount area CMA and a chip non-mount area, which are adjacent to each other. Referring to FIG. 4, there is shown a chip mount area CMA of the first central segment CA1 in which the light emitting device chip 130 is mounted. A portion of the first central segment CA1 excluding the chip mount area CMA corresponds to a chip non-mount area. In a case in which the light emitting device chip 130 has a flip-chip bonding structure as shown in FIGS. 2 to 4, an area in which the submount 140 is disposed corresponds to the chip mount area CMA.

In FIGS. 2 to 4, the light emitting device chip 130 and the submount 140 are disposed on the first body 110A of the package body 110. However, embodiments are not limited thereto. According to an alternative embodiment, the light emitting device chip 130 and the submount 140 may be disposed on the second body 110B of the package body 110. Even in this case, the following description will be similarly applied. In this case, a portion of the second central segment CA2 in which the light emitting device chip 130 and the submount 140 are disposed corresponds to a chip mount area CMA and a portion of the second central segment CA2 excluding the chip mount area CMA corresponds to a chip non-mount area.

The peripheral area is an area around the central area CA. The peripheral area is defined as including a periphery of the package body 110. The peripheral area may be divided into first and second peripheral segments PA1 and PA2. The first peripheral segment PA1 corresponds to a portion of the first body 110A excluding the first central segment CA1 and the second peripheral segment PA2 corresponds to a portion of the second body 110B excluding the second central segment CA2.

The package body 110 may be formed of ceramic or metal. In a case which the light emitting device chip 130 emits ultraviolet (UV)-wavelength light, specifically deep UV-wavelength light, the package body 110 may be formed of aluminum (Al) for increasing reflectance and improving heat dissipation characteristics.

Referring to FIGS. 2 to 4, the light emitting device chip 130 is disposed on the submount 140 and the submount 140 is mounted at the chip mount area CMA on the first body 110A of the package body 110. The submount 140 is disposed between the light emitting device chip 130 and the first body 110A. In a case in which the light emitting device chip 130 has a horizontal or vertical type structure as will hereinafter be described, the light emitting device chip 130 is disposed on the chip mount area CMA of the first body 110A of the package body 110.

The light emitting device chip 130 includes a light emitting diode (LED) using a plurality of compound semiconductor layers, e.g. group III-V compound semiconductor layers. The LED may be a color LED emitting blue light, green light, or red light, an ultraviolet (UV) LED, specifically deep UV (DUV) LED, or a non-polar LED. Light emitted from the LED may be realized using various semiconductors. However, embodiments are not limited thereto.

Figure 5A:
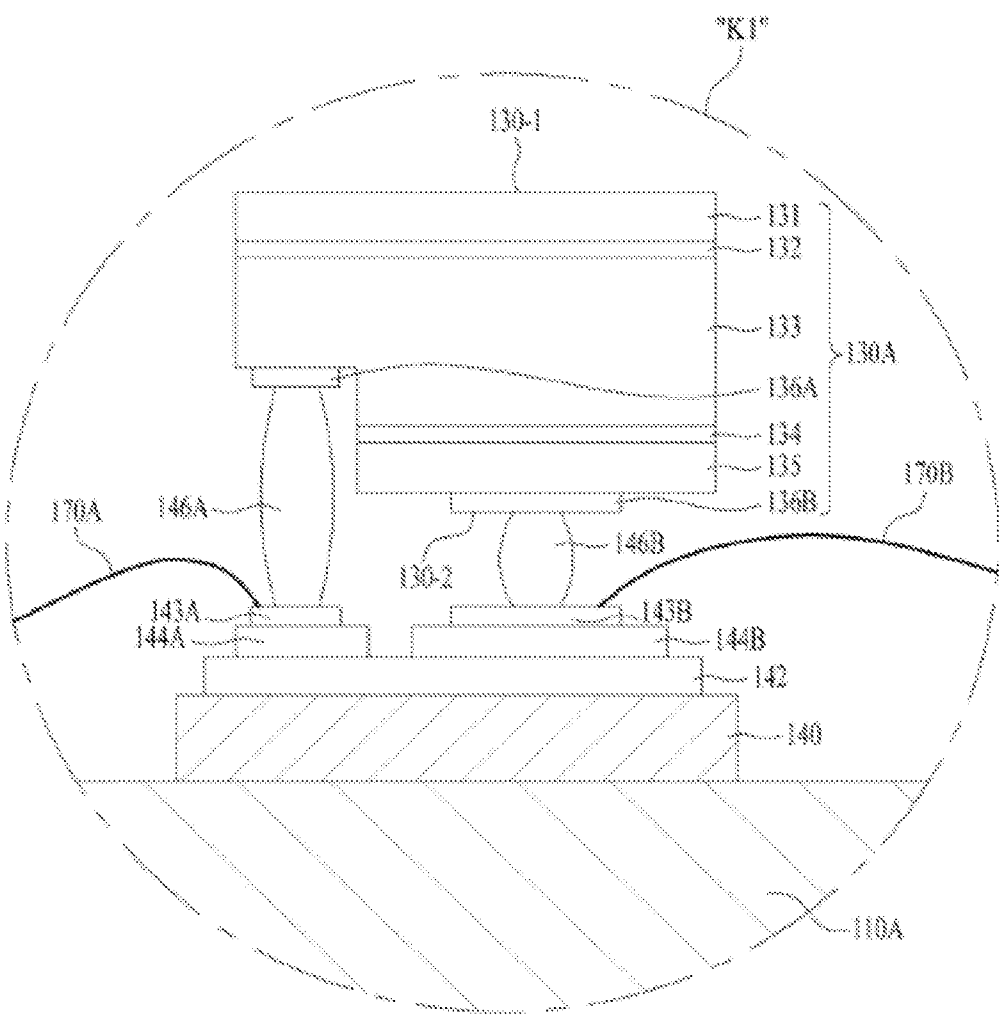
FIGS. 5A to 5C are enlarged sectional views showing embodiments of portion 'K' of FIG. 4.
Figure 5B:
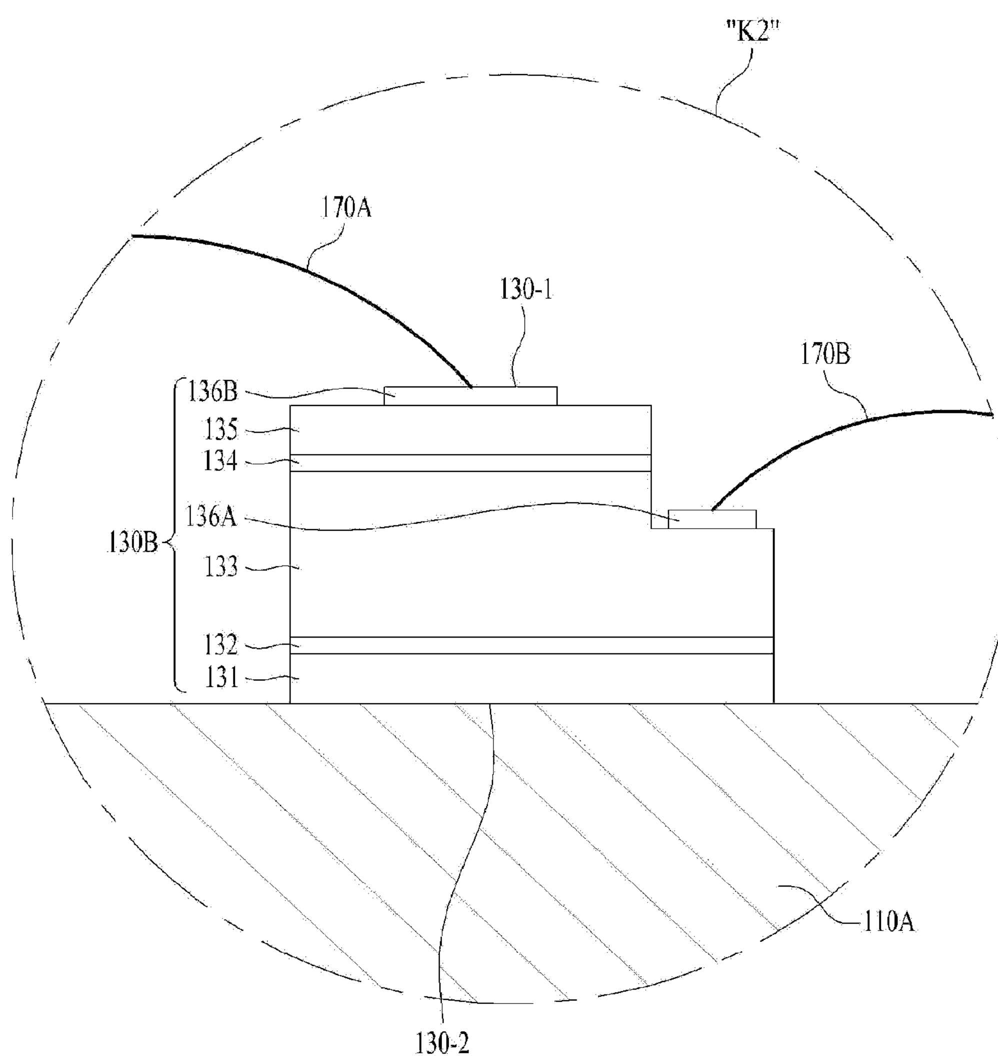
Figure 5C:
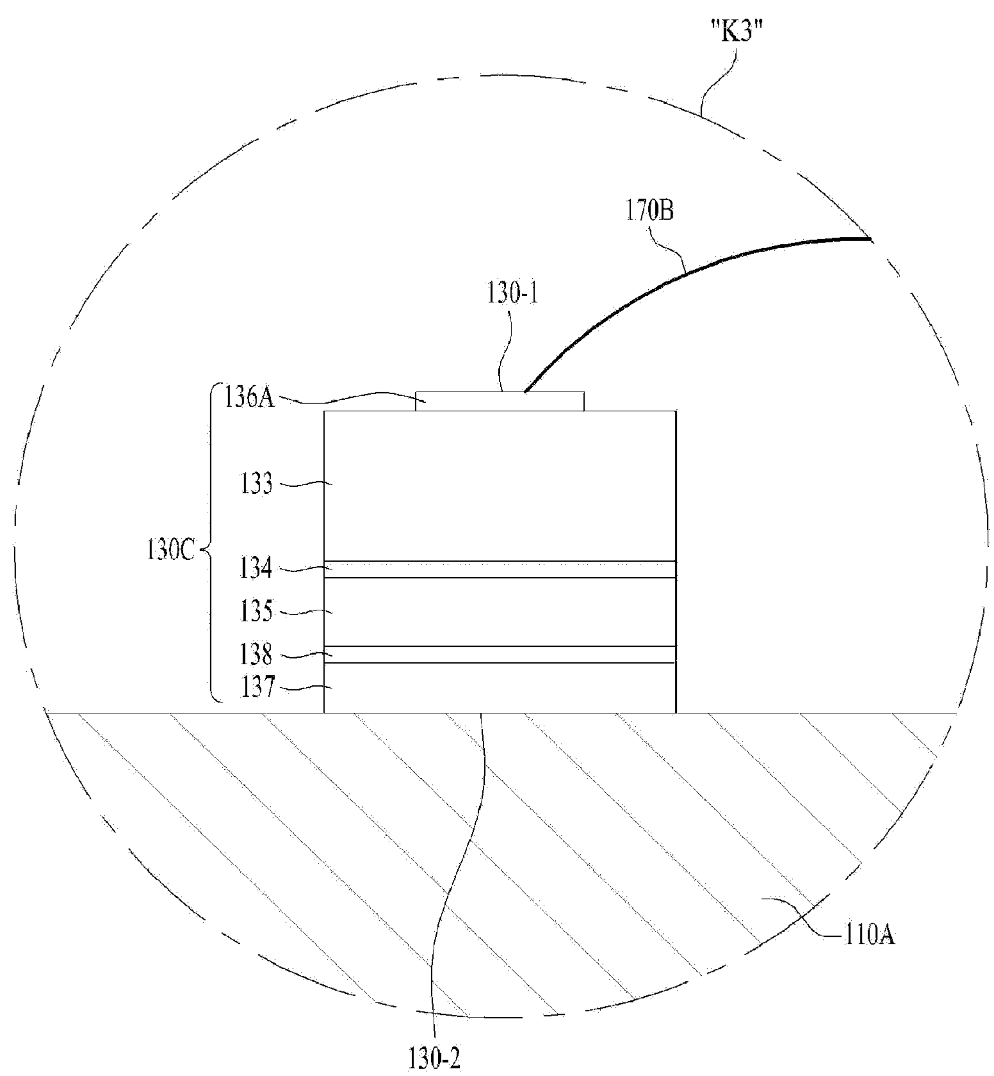

FIGS. 5A to 5C are enlarged sectional views showing embodiments K1, K2, and K3 of a portion 'K' of FIG. 4. Reference symbols 130A, 130B, and 130C correspond to embodiments of the light emitting device chip 130 of FIG. 4.

Referring to FIG. 5A, according to an embodiment, the light emitting device chip 130A includes a substrate 131, a buffer layer 132, a light emitting structure 133, 134, and 135, and first and second electrodes 136A and 136B.

The substrate 131 may be transparent such that light emitted from the active layer 134 exits through the substrate 131. For example, the substrate 131 may be formed of at least one selected from among sapphire ($Al_2O_3$), SiC, GaAs, GaN, ZnO, Si, GaP, InP, and Ge. However, embodiments are not limited thereto. In addition, the substrate 131 may have mechanical strength, by which the entirety of the nitride semiconductor is prevent from being bent while the substrate 131 is easily cut into individual chips through a scribing process and a breaking process.

The buffer layer 132 is disposed between the substrate 131 and the light emitting structure 133, 134, and 135 to improve lattice match between the substrate 131 and the light emitting structure 133, 134, and 135. For example, the buffer layer 132 may include AlN or an undoped nitride. However, embodiments are not limited thereto. The buffer layer 132 may be omitted depending upon type of the substrate 131 and the light emitting structure 133, 134, and 135.

The light emitting structure is disposed under the buffer layer 132. The light emitting structure may include a first conductive semiconductor layer 133, an active layer 134, and a second conductive semiconductor layer 135, which are sequentially stacked.

The first conductive semiconductor layer 133 is disposed between the buffer layer 132 and the active layer 134. The first conductive semiconductor layer 133 may be formed of a compound semiconductor. The first conductive semiconductor layer 133 may be formed of a group III-V or II-VI compound semiconductor, which may be doped with a first conductive dopant.

For example, the first conductive semiconductor layer 133 may be formed of at least one selected from among a semiconductor material having a formula of $Al_xIn_yGa_{(1-x-y)}N$ ($0 \le x \le 1$, $0 \le y \le 1$, $0 \le x+y \le 1$), InAlGaN, AlGaAs, GaP, GaAs, GaAsP, and AlGaInP. In a case in which the first conductive semiconductor layer 133 is an n-type semiconductor layer, the first conductive dopant may include an n-type dopant, such as Si, Ge, Sn, Se, or Te. The first conductive semiconductor layer 133 may be a single-layer or a multi-layer. However, embodiments are not limited thereto. In a case in which the light emitting device chip 130A of FIG. 5A is a UV, specifically deep UV, or non-polar light emitting device, the first conductive semiconductor layer 133 may include at least one of InAlGaN or AlGaN.

The active layer 134 is disposed between the first conductive semiconductor layer 133 and the second conductive semiconductor layer 135. The active layer 134 may include at least one selected from among a single well structure, a multi well structure, a single quantum well structure, and a multi quantum well (MQW) structure, a quantum dot structure, and a quantum wire structure. The active layer 134 may be formed to have at least one pair structure of a well layer and a barrier layer selected from among InGaN/GaN, InGaN/InGaN, GaN/AlGaN, InAlGaN/GaN, GaAs(InGaAs)/AlGaAs, and GaP(InGaP)/AlGaP using a group III-V compound semiconductor material. However, embodiments are not limited thereto. The well layer may be formed of a material having an energy band gap lower than that of the barrier layer. Particularly, in this embodiment, the active layer 134 may generate UV-wavelength, specifically deep UV-wavelength, light.

The second conductive semiconductor layer 135 may be disposed under the active layer 134. The second conductive semiconductor layer 135 may be formed of a compound semiconductor. The second conductive semiconductor layer 135 may be formed of a group III-V or II-VI compound semiconductor, which may be doped with a second conductive dopant. For example, the second conductive semiconductor layer 135 may be formed of at least one selected from among a semiconductor material having a formula of $In_x$-

$AlGa_{1-x-y}N$ ($0 \leq x \leq 1$, $0 \leq y \leq 1$, $0 \leq x+y \leq 1$), AlInN, AlGaAs, GaP, GaAs, GaAsP, and AlGaInP. In a case in which the second conductive semiconductor layer 135 is a p-type semiconductor layer, the second conductive dopant may be a p-type dopant, such as Mg, Zn, Ca, Sr, or Ba. The second conductive semiconductor layer 135 may be a single-layer or a multi-layer. However, embodiments are not limited thereto. In a case in which the light emitting device chip 130A is a UV (specifically, DUV) or non-polar light emitting device, the second conductive semiconductor layer 135 may include at least one of InAlGaN or AlGaN.

The first electrode 136A is disposed under the first conductive semiconductor layer 133. For example, the first electrode 136A may include at least one of AlN or BN. However, embodiments are not limited thereto. That is, the first electrode 136A may be formed of any material that may not absorb but reflect or transmit light emitted from the active layer 134 and may be grown on the first conductive semiconductor layer 133 with high quality.

The first electrode 136A may include an ohmic contact material such that the first electrode 136A can execute an ohmic function. In this case, there may be no need to provide an additional ohmic layer (not shown). On the other hand, an additional ohmic layer may be disposed under the first electrode 136A.

The second electrode 136B contacts the second conductive semiconductor layer 135. The second electrode 136B may be formed of metal. For example, the second electrode 136B may be formed of Ag, Ni, Al, Rh, Pd, Ir, Ru, Mg, Zn, Pt, Au, Hf, or a selective combination thereof.

The second electrode 136B may be a transparent conductive oxide (TCO). For example, the second electrode 136B may include at least one selected from among the above-specified metal materials, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO. However, embodiments are not limited thereto. The second electrode 136B may include a material ohmic-contacting the second conductive semiconductor layer 135.

In addition, the second electrode 136B may be formed of a reflective electrode material exhibiting ohmic characteristics and may have a single-layer structure or a multi-layer structure. In a case in which the second electrode 136B executes an ohmic function, an additional ohmic layer (not shown) may not be formed.

The light emitting device package 100A may further include a passivation layer 142 disposed between the light emitting device chip 130A and the submount 140, first and second electrode pads 144A and 144B, and first and second bumps 146A and 146B.

The first and second electrodes 136A and 136B of the light emitting device chip 130A having a flip-chip bonding structure shown in FIG. 5A are located on the submount 140 in a flip-chip bonding fashion.

The submount 140 may be formed of a semiconductor substrate, such as AlN, BN, silicon carbide (SiC), GaN, GaAs, or Si. However, embodiments are not limited thereto. For example, the submount 140 may be formed of a semiconductor material exhibiting high thermal conductivity. In addition, a Zener diode type device for electrostatic discharge (ESD) prevention may be included in the submount 140.

The first electrode 136A is connected to the first electrode pad 144A of the submount 140 via the first bump 146A and the second electrode 136B is connected to the second electrode pad 144B of the submount 140 via the second bump 146B. The wires 170A and 170B electrically connect the light emitting device chip 130A to the package body 110. In other words, the first electrode pad 144A is connected to the first body 110A via the wire 170A and the second electrode pad 144B is connected to the second body 110B via the wire 170B.

Although not shown, a first upper bump metal layer (not shown) may be further disposed between the first electrode 136A and the first bump 146A and a first lower bump metal layer 143A may be further disposed between the first electrode pad 144A and the first bump 146A. The first upper bump metal layer and the first lower bump metal layer 143A serve to indicate a position of the first bump 146A. Similarly, a second upper bump metal layer (not shown) may be further disposed between the second electrode 136B and the second bump 146B and a second lower bump metal layer 143B may be further disposed between the second electrode pad 144B and the second bump 146B. The second upper bump metal layer and the second lower bump metal layer 143B serve to indicate a position of the second bump 146B.

In a case in which the submount is formed of a material, such as Si, exhibiting electrical conductivity, a passivation layer 142 may be further disposed between the first and second electrode pads 144A and 144B and the submount 140 as shown in FIG. 5A. The passivation layer 142 may be formed of an insulative material.

In the light emitting device package 100A shown in FIGS. 2 to 4, the light emitting device chip 130 may have a configuration (130A) in which the light emitting device chip 130 is connected to the package body 110 to have a flip-chip bonding structure as shown in FIG. 5A. However, embodiments are not limited thereto. According to other embodiments, the light emitting device chip 130 may have a configuration (130B) in which the light emitting device chip 130 is connected to the package body 110 to have a horizontal bonding structure as shown in FIG. 5B and a configuration (130C) in which the light emitting device chip 130 is connected to the package body 110 to have a vertical bonding structure as shown in FIG. 5C. In the horizontal and vertical bonding structures, the submount 140 is omitted. Particularly in the vertical bonding structure, the light emitting device chip 130 may be directly mounted on the package body 110 such that the light emitting device chip 130 is electrically connected to the first body 110A without the wire 170A. Details thereof will be described.

Since the light emitting device chip 130A shown in FIGS. 2, 3, 4, and 5A has the flip-chip bonding structure, light emitted from the active layer 134 exits through the first conductive semiconductor layer 133, the buffer layer 132, and the substrate 131. Consequently, the first conductive semiconductor layer 133, the buffer layer 132, and the substrate 131 may be formed of a transparent material.

On the other hand, since the light emitting device chip 130B shown in FIG. 5B has the horizontal bonding structure, light emitted from the active layer 134 exits through the second conductive semiconductor layer 135 and the second electrode 136B. To this end, the second conductive semiconductor layer 135 and the second electrode 136B shown in FIG. 5B may be formed of a transparent material and the first conductive semiconductor layer 133, the buffer layer 132, and the substrate 131 may be formed of a transparent or non-transparent material. In addition, since the light emitting device chip 130B shown in FIG. 5B has the horizontal bonding structure, not the flip-chip bonding structure, the first and second bumps 146A and 146B, the first and second electrode pads 144A and 144B, the passivation layer 142, the submount 140, the first lower bump metal layer 143A, and the second lower bump metal layer 143B are not needed. Except the above differences, the light emitting device chip 130B shown in FIG. 5B is identical to the light emitting device chip 130A shown in FIG. 5A. Consequently, the same reference symbols are used and a detailed description thereof will be omitted.

In addition, the light emitting device chip 130C having the vertical bonding structure shown in FIG. 5C includes a support 137, a reflective layer 138, a light emitting structure 133, 134, and 135, and a first electrode 136A.

The support 137 may include a conductive material or a nonconductive material. For example, the support 137 may be formed of at least one selected from among sapphire ($Al_2O_3$), GaN, SiC, ZnO, GaP, InP, $Ga_2O_3$, GaAs, and Si. However, embodiments are not limited thereto. In a case in which the support 137 is conductive, the entirety of the support 137 may serve as a p-type electrode together with the reflective layer 138. Consequently, the support 137 may be formed of a metal exhibiting high electrical conductivity. In addition, the support 137 may be formed of a metal exhibiting high thermal conductivity since it is necessary for the support 137 to sufficiently dissipate heat generated during operation of the light emitting device.

For example, the support 137 may be formed of a material selected from a group consisting of molybdenum (Mo), silicon (Si), tungsten (W), copper (Cu), and aluminum (Al) or an alloy thereof. In addition, the support 137 may selectively include at least one of gold (Au), copper alloy (Cu Alloy), nickel (Ni), copper-tungsten (Cu—W), or a carrier wafer (e.g. at least one of GaN, Si, Ge, GaAs, ZnO, SiGe, SiC, SiGe, or $Ga_2O_3$).

The reflective layer 138 serves to reflect light emitted from the active layer 134 upward. The reflective layer 138 is disposed on the support 137. The reflective layer 138 may have a thickness of about 2500 Å. For example, the reflective layer 138 may be formed of a metal layer including aluminum (Al), silver (Ag), nickel (Ni), platinum (Pt), rhodium (Rh), or an alloy including at least one of Al, Ag, Pt, or Rh. Aluminum or silver may effectively reflect light generated from the active layer 134, thereby greatly improving light extraction efficiency of the light emitting device.

Referring to FIG. 5C, light emitted from the active layer 134 exits through the first conductive semiconductor layer 133 and the first electrode 136A. To this end, the first conductive semiconductor layer 133 and the first electrode 136A may be formed of a transparent material and the second conductive semiconductor layer 135 may be formed of a transparent or non-transparent material. In addition, since the light emitting device chip 130C shown in FIG. 5C has the vertical bonding structure, not the flip-chip bonding structure, the first and second bumps 146A and 146B, the first and second electrode pads 144A and 144B, the passivation layer 142, the submount 140, the first lower bump metal layer 143A, and the second lower bump metal layer 143B are not needed. Except the above differences, the light emitting device chip 130C shown in FIG. 5C is identical to the light emitting device chip 130A shown in FIG. 5A. Consequently, the same reference symbols are used and a detailed description thereof will be omitted.

Referring to FIGS. 2 to 5C, an upper surface 130-1 of the light emitting device chip 130 is higher than an upper surface 111A of the package body 110 in the chip non-mount area of the central area CA and than an upper surface 111B of the package body 110 in the peripheral area PA1 and PA2. In addition, a lower surface 130-2 of the light emitting device chip 130 is higher than the upper surface 111A of the package body 110 in the chip non-mount area of the central area CA and than the upper surface 111B of the package body 110 in the peripheral area PA1 and PA2.

The upper surface 130-1 of the light emitting device chip 130A shown in FIG. 5A corresponds to the top surface of the substrate 131, the upper surface 130-1 of the light emitting device chip 130B shown in FIG. 5B corresponds to the top surface of the second electrode 136B, and the upper surface 130-1 of the light emitting device chip 130C shown in FIG. 5C corresponds to the top surface of the first electrode 136A.

In addition, the lower surface 130-2 of the light emitting device chip 130A shown in FIG. 5A corresponds to the bottom surface of the second electrode 136B, the lower surface 130-2 of the light emitting device chip 130B shown in FIG. 5B corresponds to the bottom surface of the substrate 131, and the lower surface 130-2 of the light emitting device chip 130C shown in FIG. 5C corresponds to the bottom surface of the support 137.

Figure 1:
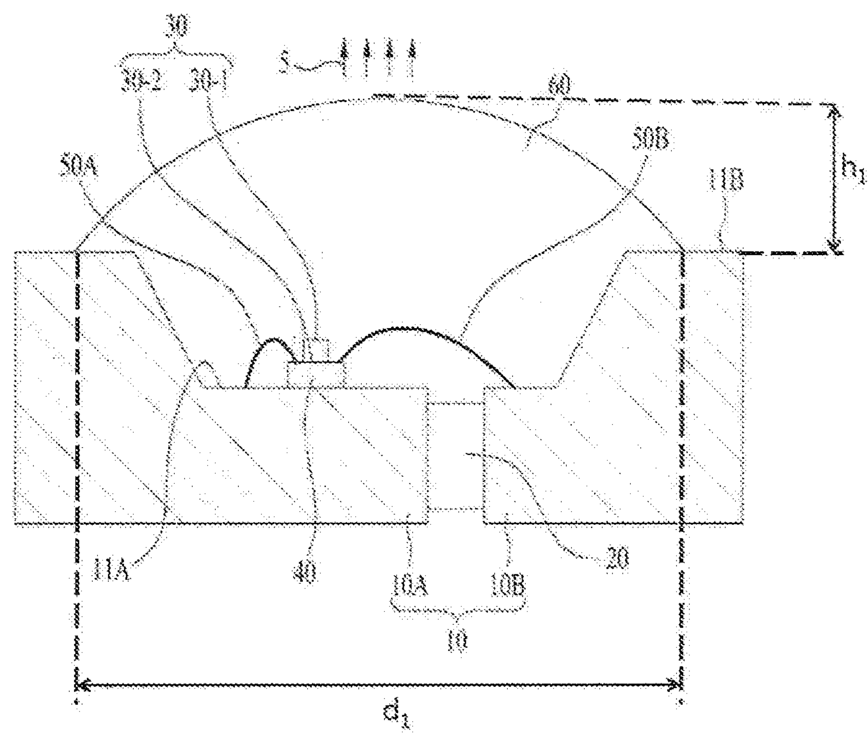
FIG. 1 is a sectional view showing a conventional light emitting device package.

In the light emitting device package shown in FIG. 1, an upper surface 30-1 and a lower surface 30-2 of the light emitting device chip 30 is higher than an upper surface 11A of a central area of the package body 10 but is lower than an upper surface 11B of a peripheral area of the package body 10. Consequently, light emitted from the light emitting device chip 30 may be captured in a cavity of the package body 10 with the result that the light may not escape from the light emitting device package. Furthermore, light emitted from the light emitting device chip 30 may not escape in all directions but may escape only in a vertical direction 5 of the light emitting device package.

On the other hand, light emitted from the light emitting device chip 130 having the aforementioned structure as shown in FIGS. 2 to 4 escape from the light emitting device package without being captured in the package body 110. Consequently, light extraction efficiency may be improved by about 25%. Furthermore, the light emitting device package 100A according to the embodiment may emit light not only in the vertical direction 5 but also in all directions 7 as indicated by arrows of FIG. 4.

Meanwhile, referring to FIGS. 2 to 4, the molding member 150A is disposed on the package body 110 while surrounding the light emitting device chip 130. In addition, the molding member 150A may include a fluorescent substance, which may change wavelength of light emitted from the light emitting device chip 130.

The package body 110 according to the embodiment includes at least one molding groove 114. The at least one molding groove 114 is disposed in the peripheral area PA1 and PA2 on the package body 110 at an interface between the central area CA1 and CA2 and the peripheral area PA1 and PA2.

Figure 6:
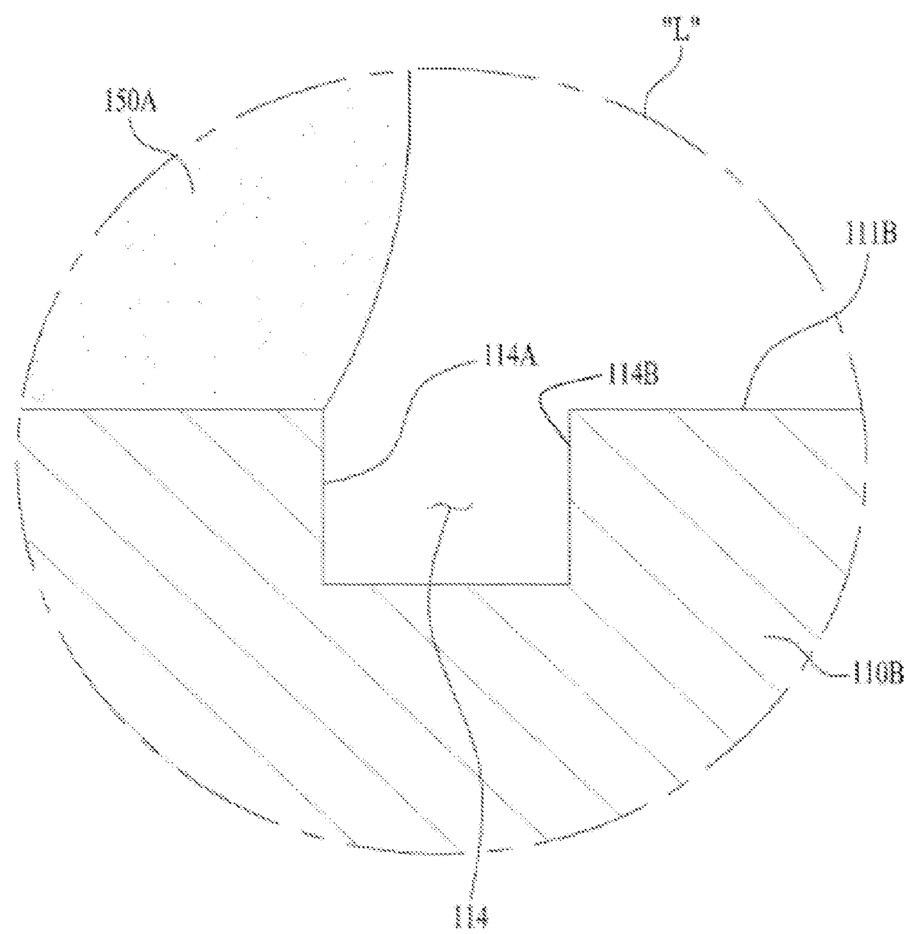
FIG. 6 is an enlarged partial sectional view showing a portion 'L' of FIG. 4.

FIG. 6 is an enlarged partial sectional view showing a portion 'L' of FIG. 4. The molding member 150A is disposed to extend up to an inside edge 114A (e.g. an interface between the central area CA2 and the peripheral area PA2) of the at least one molding groove 114.

Figure 7A:
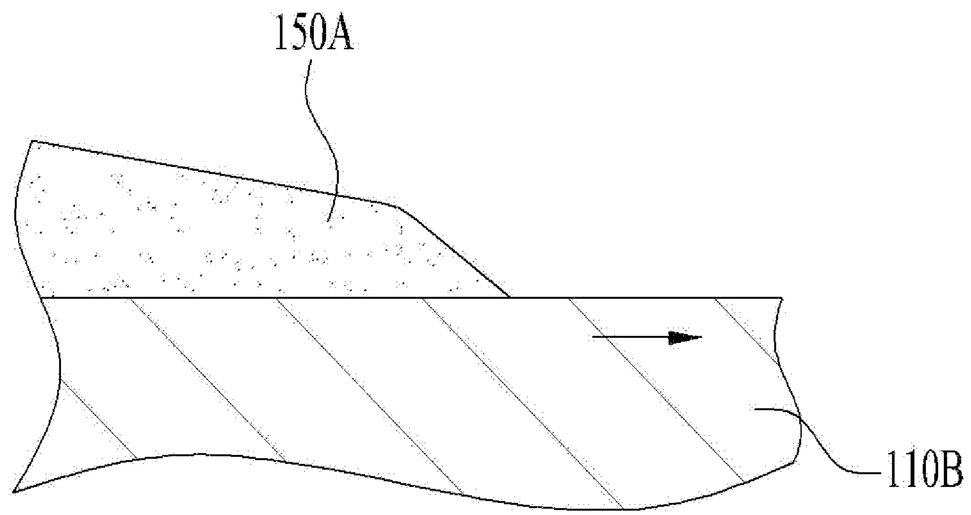
FIGS. 7A and 7B are views illustrating a radius of curvature of a molding member.
Figure 7B:
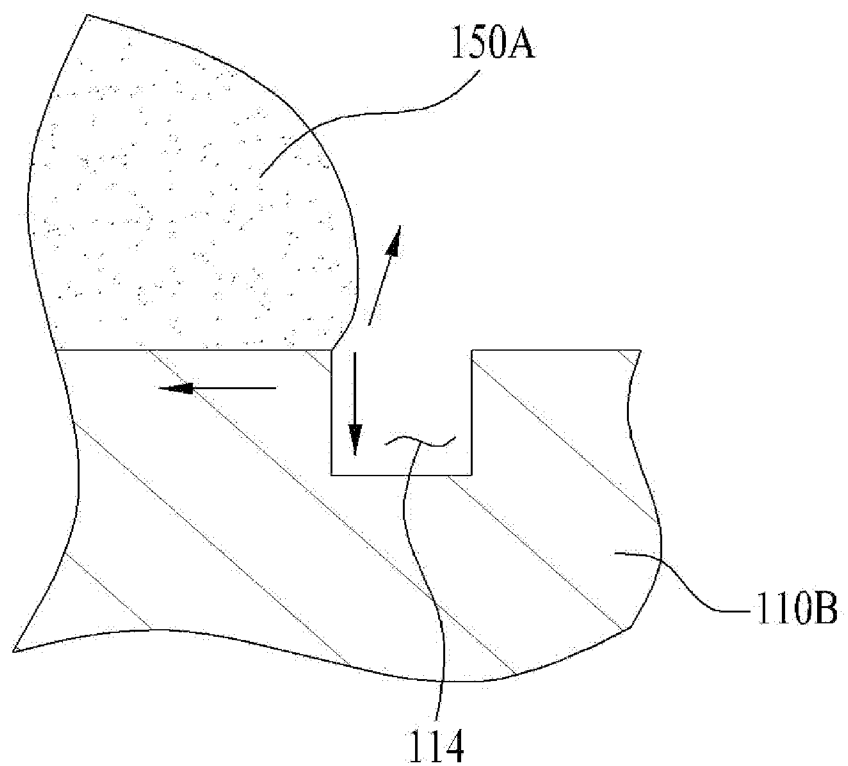

FIGS. 7A and 7B are views illustrating a radius of curvature of the molding member 150A. In a case in which the light emitting device chip 130 emits DUV light having a wavelength band of 200 nm to 405 nm, a gel type molding member 150A having lower viscosity than in a case in which blue light is emitted as previously described is used. For example, in case that the light emitting device chip 130 emits blue light, the molding member 150A has the viscosity ranging from 3,000 mPa·sec to 30,000 mPa·sec at an initial liquid form prior to hardening. In contrast, in case that the light emitting device chip 130 emits light having the wavelength ranging from 200 nm to 405 nm, the molding member 150A may have the viscosity ranging from 0 to 3,000 mPa·sec at an initial liquid form prior to hardening.

In this case, as shown in FIG. 7A, the low-viscosity molding member 150A may not have a convex hemispherical shape but a flattened hemispherical shape spread in a direction indicated by an arrow. In a case in which the radius of curvature of the molding member 150A is big as described above, light extraction efficiency of the light emitting device package is lowered.

In the light emitting device package 100A according to the embodiment, on the other hand, the at least one molding groove 114 is disposed at the peripheral area PA1 and PA2 on the package body 110. Even in a case in which the viscosity of the molding member 150A is low, the low-viscosity molding member 150A may have an inflated hemispherical shape or a dome shape since horizontally spreading thereof is suppressed by surface tension indicated by arrows as shown in FIG. 7B. Consequently, the radius of curvature of the molding member 150A is decreased, thereby improving light extraction efficiency of the light emitting device package 100A.

In case that the light emitting device chip 30 emits light having a wavelength ranging from 430 nm to 485 nm, the molding member 60 has a first height h1 ranging from 0 to 0.1d1 on the basis of the uppermost surface of the cavity in the conventional light emitting device packages as shown in FIG. 1. Here, ‘d1’ means the width of the molding member 60 positioned over the uppermost surface of the package body 10. Also, referring to FIG. 4, in case that the light emitting device chip 130 emits light having a wavelength ranging from 200 nm to 405 nm, the molding member 150A has a second height h2 ranging from 0.15d2 to 0.35d2 on the basis of the uppermost surface 111B of the package body 110. Here, ‘d2’ means the width of the molding member 150A positioned over the uppermost surface 111B of the package body 110 and is subsequently equal to the width of the central area CA.

Thus, since the at least one molding groove 114 is disposed in the embodiment, the second height h2 of the molding member 150A may increase by from 0.05d to 0.35d (if assuming that d1=d2=d), in comparison to the first height h1. Namely, the difference between the second height h2 and the first height h1 may range from 0.05d to 0.35d.

Alternatively, differently from the structure illustrated in FIG. 6, the molding member 150A may be disposed to outer edges 114B of the at least molding groove 114 while filling the at least one molding groove 114. Accordingly, the binding force between the package body 110 and the molding member 150A may be increased.

In a case in which the light emitting device chips 30 and 130 emit DUV-wavelength light, therefore, it can be seen that the radius of curvature of the molding member 150A of the light emitting device package 100A according to the embodiment shown in FIGS. 2 to 4 becomes smaller than that of the molding part 60 of the conventional light emitting device package shown in FIG. 1. That is, it can be seen that the molding member 150A has a more convex shape than the molding part 60. Consequently, light extraction efficiency of the light emitting device package 100A according to the embodiment may be improved by the provision of the at least one molding groove 114.

In addition, the viscosity of the molding member 150A may be raised to further decrease the radius of curvature of the molding member 150A. The viscosity of the molding member 150A may be adjusted using the content of the material contained in the molding member 150A.

In addition, referring to FIG. 4, a larger amount of light may be emitted in all directions as a distance ‘a’ between the upper surface 130-1 of the light emitting device chip 130 and a vertex of the molding member 150A is increased. Furthermore, a distance d3 from the submount 140 to the molding groove 114 may be increased to increase a second height h2 of the molding member 150A such that light can be further diffused in all directions.

In addition, according to an embodiment, the at least one molding groove 114 may have various planar shapes. For example, the molding groove 114 may have a circular plan shape as shown in FIG. 3. However, embodiments are not limited thereto.

Figure 8:
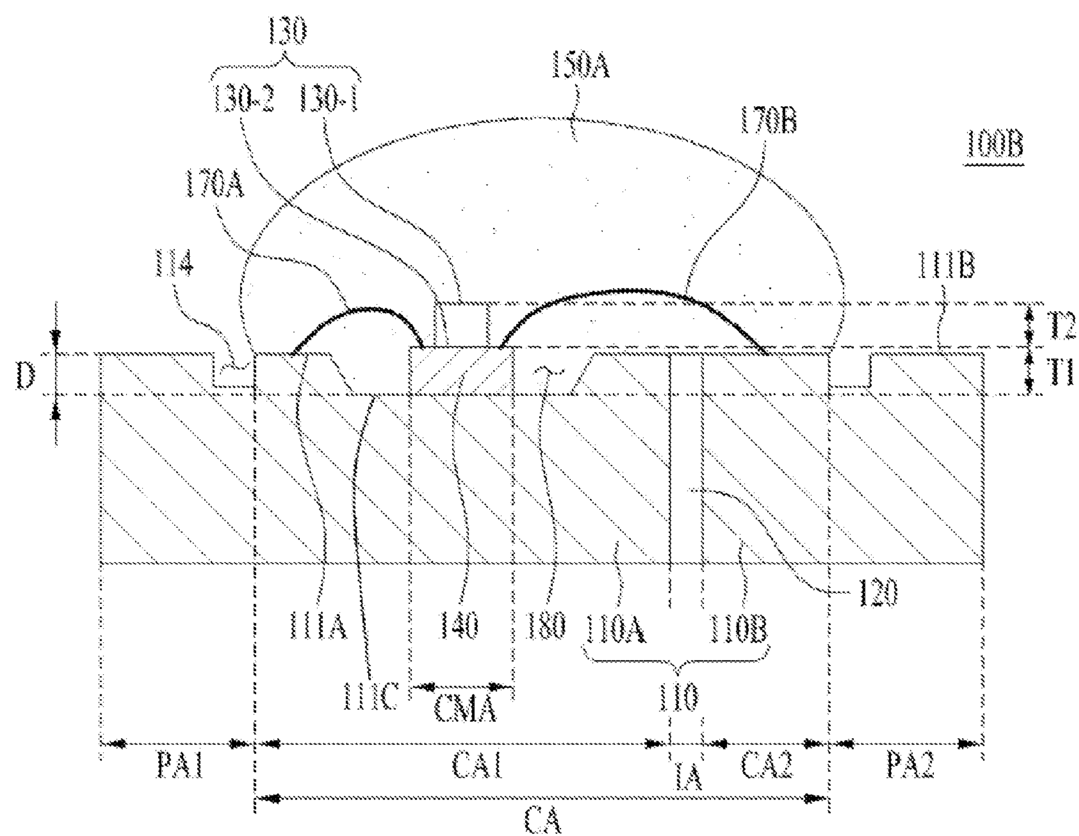
FIG. 8 is a sectional view showing a light emitting device package according to another embodiment.

FIG. 8 is a sectional view showing a light emitting device package 100B according to another embodiment. The light emitting device package 100A shown in FIG. 4 has no cavity at the central area CA. On the other hand, the light emitting device package 100B shown in FIG. 8 has a first cavity 180. That is, the upper surface 111A of the central area CA of the light emitting device package 100A shown in FIG. 4 has no step. On the other hand, a central area CA of the light emitting device package 100B shown in FIG. 8 has a step formed by the presence of the first cavity 180. Except the above difference, the light emitting device package 100B shown in FIG. 8 is identical to the light emitting device package 100A shown in FIG. 4. Consequently, the same reference symbols are used and a repeated description thereof will be omitted.

Referring to FIG. 8, the first cavity 180 is positioned in a first central segment CA1 of the central area CA. The first cavity 180 extends over a chip mount area CMA and a chip non-mount area. Alternatively, the first cavity 180 may be positioned in a second central segment CA2 of the central area CA unlike FIG. 8.

Although the first cavity 180 is provided in the central area CA in which a light emitting device chip 130 is disposed, light emitted from the light emitting device chip 130 is not captured in the first cavity 180 since each of an upper surface 130-1 and a lower surface 130-2 of the light emitting device chip 130 is higher than upper surfaces 111A and 111C of a package body 110 in the chip non-mount area. To this end, a submount 140 may have a thickness T1 greater than a depth D of the first cavity 180. In a case in which the light emitting device chip 130 has a horizontal or vertical type structure as shown in FIG. 5B or 5C, the submount 140 is omitted. In this case, the light emitting device chip 130 may have a thickness T2 greater than the depth D of the first cavity 180.

Figure 9:
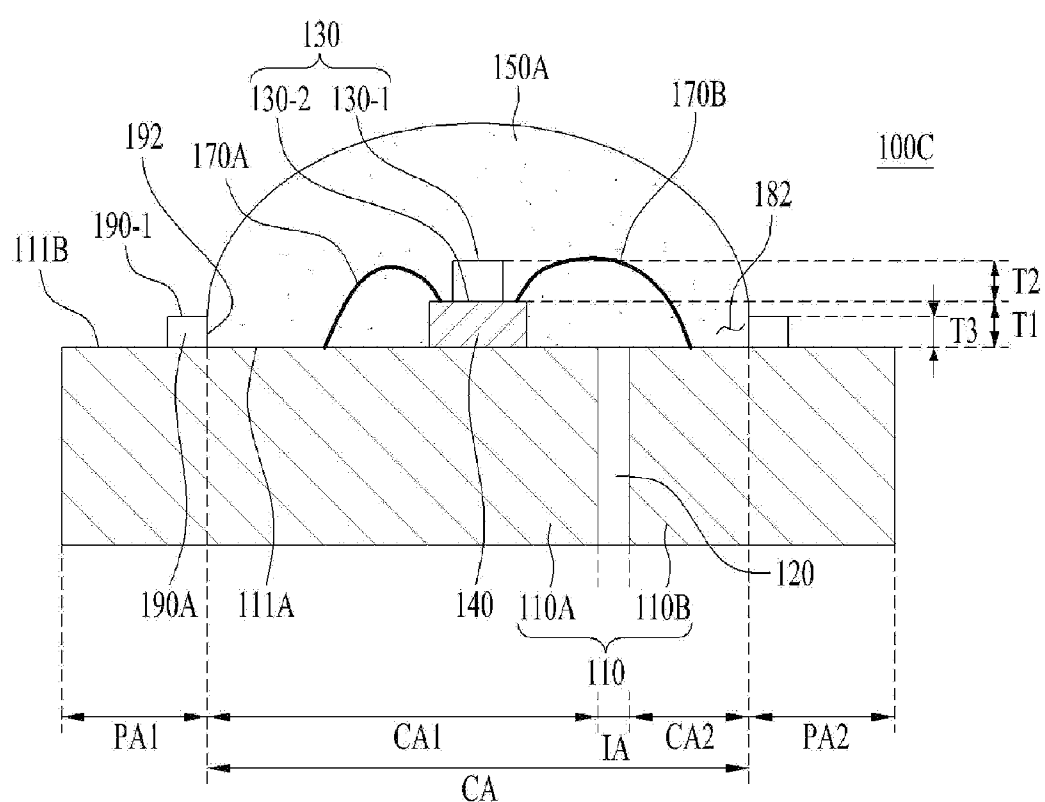
FIG. 9 is a sectional view showing a light emitting device package according to still another embodiment.

FIG. 9 is a sectional view showing a light emitting device package 100C according to still another embodiment. The light emitting device packages 100A and 100B shown in FIGS. 4 and 8 each have a molding groove 114, whereas the light emitting device package 100C shown in FIG. 9 has a dam 190A. Except the above difference, the light emitting device package 100C shown in FIG. 9 is identical to the light emitting device package 100A shown in FIG. 4. Consequently, the same reference symbols are used and a repeated description thereof will be omitted.

The dam 190A may be formed at the same position as the molding groove 114. That is, the dam 190A may be disposed in a peripheral area PA1 and PA2 on a package body 110 at an interface between a central area CA and the peripheral area PA1 and PA2. A second cavity 182 defined by the dam 190A is formed over the central area CA. Although the second cavity 182, in which a light emitting device chip 130 is disposed, is provided, light emitted from the light emitting device chip 130 is not captured in the second cavity 182 since a top surface 190-1 of the dam 190A is lower than each of an upper surface 130-1 and a lower surface 130-2 of the light emitting device chip 130. To this end, a submount 140 may have a thickness T1 greater than a depth D of the second cavity 182, i.e. a thickness T3 of the dam 190A. In a case in which the light emitting device chip 130 has a horizontal or vertical type structure as shown in FIG. 5B or 5C, the submount 140 is omitted. In this case, the light emitting device chip 130 may have a thickness T2 greater than the thickness T3 of the dam 190A.

In addition, a molding member 150A may be disposed to extend up to an inner wall 192 of the dam 190A while filling the second cavity 182 defined by the dam 190A.

Figure 10:
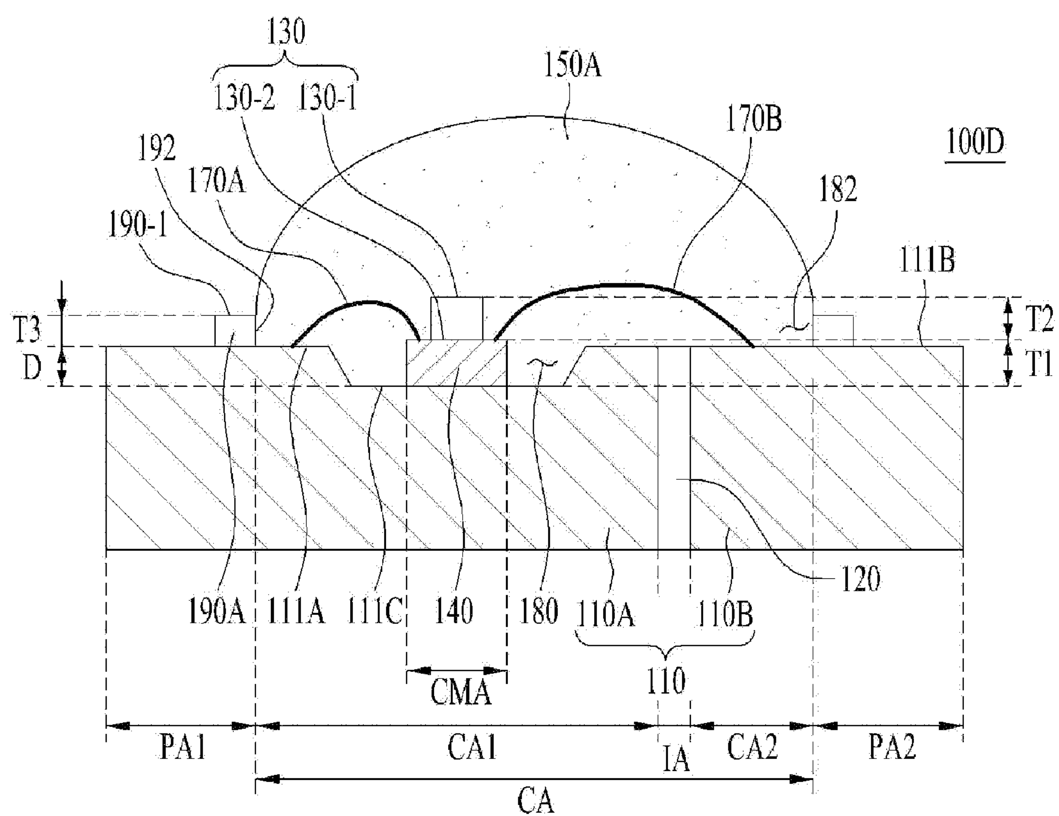
FIG. 10 is a sectional view showing a light emitting device package according to still another embodiment.

FIG. 10 is a sectional view showing a light emitting device package 100D according to still another embodiment. As compared with FIG. 9, the light emitting device package 100D shown in FIG. 10 further has a first cavity 180 in a central area CA. Except this difference, the light emitting device package 100D shown in FIG. 10 is identical to the light emitting device package 100C shown in FIG. 9. Consequently, the same reference symbols are used and a repeated description thereof will be omitted. In addition, the first cavity 180 shown in FIG. 10 is identical to the first cavity 180 shown in FIG. 8 and, therefore, a detailed description thereof will be omitted. That is, the light emitting device package 100D shown in FIG. 10 has a second cavity 182 in addition to the first cavity 180 unlike the light emitting device package 100B or 100C shown in FIG. 8 or 9.

Figure 11:
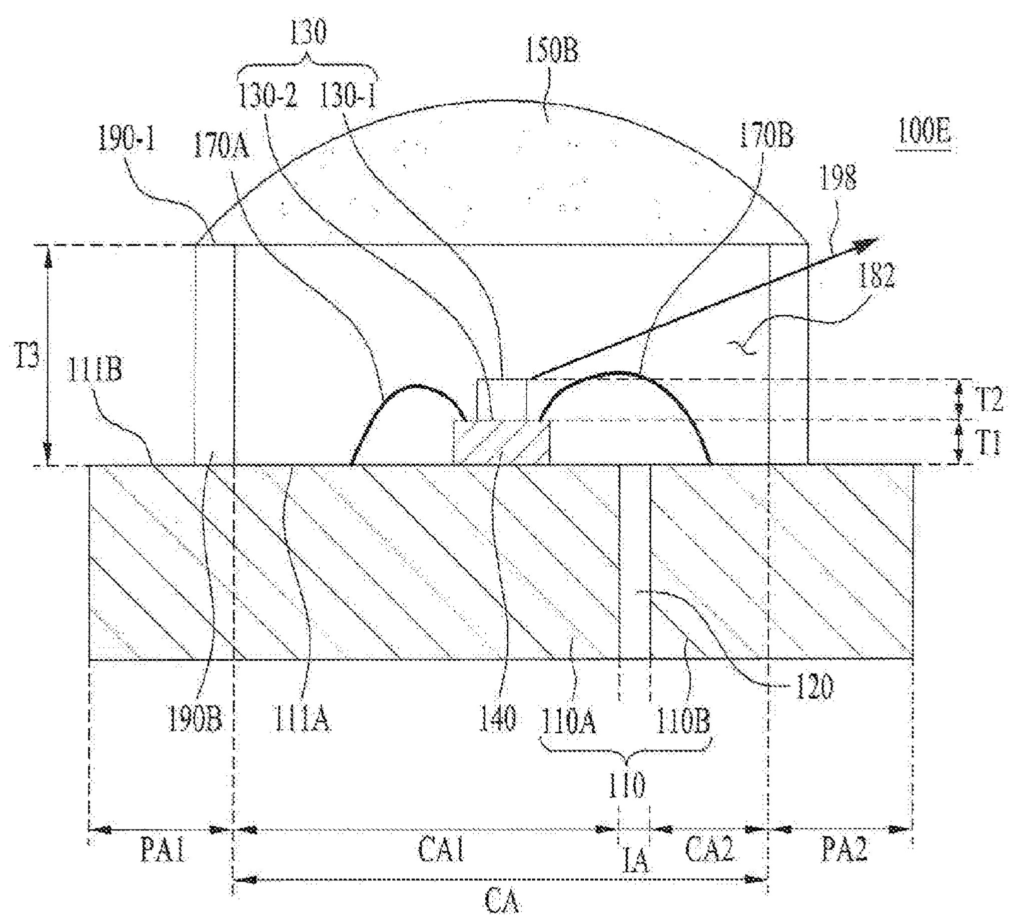
FIG. 11 is a sectional view showing a light emitting device package according to still another embodiment.

FIG. 11 is a sectional view showing a light emitting device package 100E according to still another embodiment. In the light emitting device package 100E shown in FIG. 11, a top surface 190-1 of a dam 190B is higher than each of an upper surface 130-1 and a lower surface 130-2 of a light emitting device chip 130 and a molding member 150B is not buried in a second cavity 182 but is disposed on the dam 190B. Except these differences, the light emitting device package 100E shown in FIG. 11 is identical to the light emitting device package 100C shown in FIG. 9. Consequently, the same reference symbols are used and a repeated description thereof will be omitted.

The dam 190B shown in FIG. 11 may include a transparent material, such as quartz. The dam 190B may have a thickness T3 greater than the sum (T1+T2) of a thickness T1 of a submount 140 and a thickness T2 of the light emitting device chip 130. That is, the top surface 190-1 of the dam 190B may be higher than the upper surface 130-1 of the light emitting device chip 130. As a result, the light emitting device chip 130 is captured in the second cavity 182 defined by the dam 190B. In a case in which the dam 190B is formed of a transparent material as previously described, however, light 198 emitted from the light emitting device chip 130 can transmit the dam 190B. Although the light emitting device chip 130 is captured in the second cavity 182, therefore, light extraction efficiency is not lowered.

The molding member 150B is put on the dam 190B for covering the second cavity 182. The molding member 150B has a lens shape in section. However, embodiments are not limited thereto. The molding member 150B may be coupled to the dam 190B by eutectic bonding. However, embodiments are not limited thereto.

In addition, the second cavity 182 shown in FIG. 11 may either be filled with the molding member 150B or may be filled with air. For example, the second cavity 182 may be under vacuum. In a case in which the second cavity 182 is not filled with the molding member 150B but is filled with air as described above, a phenomenon that the molding member 150B is broken may be prevented. Particularly, even when high current of 20 mA is applied to the light emitting device chip 130, a problem that the molding member 150B is broken may be fundamentally solved.

As is apparent from the above description, in a light emitting device package according to an embodiment, a light emitting device chip is not captured in a cavity but is disposed on a package body. Consequently, light is not captured in the cavity, thereby improving light extraction efficiency of the light emitting device package. In addition, a molding member is disposed over the cavity, which is under vacuum or filled with air. Consequently, the molding member is prevented from being broken. Furthermore, light may exit in all directions including a vertical direction, thereby satisfying various demands of consumers who wish radial light emission.

A plurality of light emitting device packages may be arrayed on a board and optical members, such as a light guide plate, a prism sheet, a diffusion sheet, and a fluorescent sheet, may be disposed over a course of light emitted from the light emitting device packages. The light emitting device packages, the board, and the optical members may function as a backlight unit or a lighting unit or may be applied to various kinds of electronic products, such as an air sterilization apparatus. For example, a lighting apparatus may include a backlight unit, a lighting unit, an indication apparatus, a lamp, and a streetlight.

Figure 12:
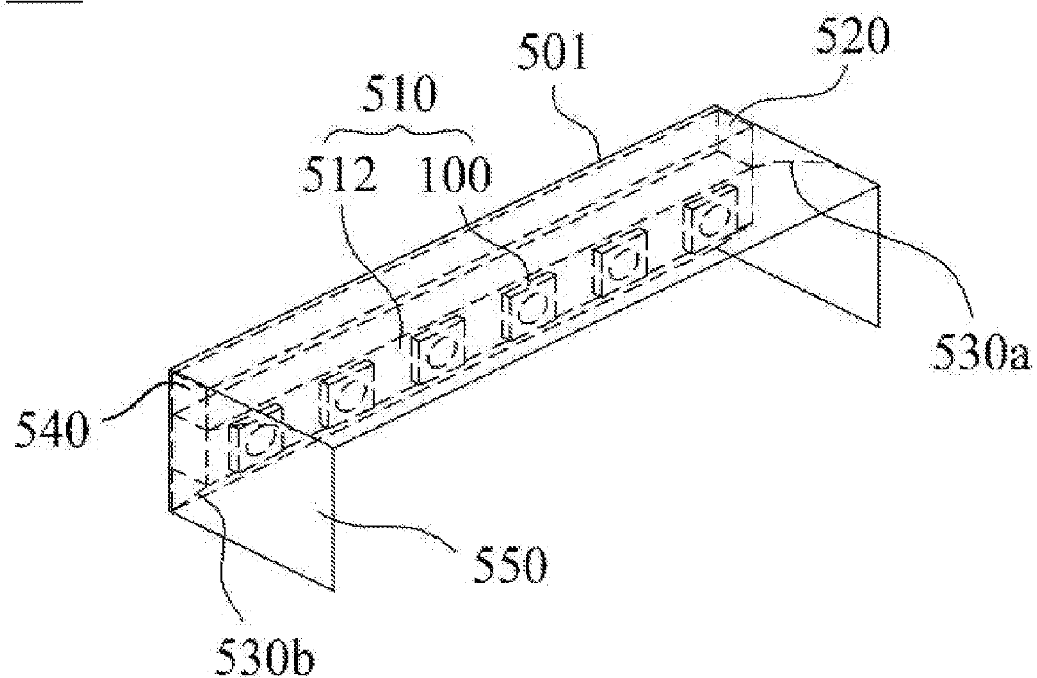
FIG. 12 is a perspective view showing an air sterilization apparatus including light emitting device packages according to an embodiment.

FIG. 12 is a perspective view showing an air sterilization apparatus 500 according to an embodiment. Referring to FIG. 12, the air sterilization apparatus 500 includes a light emitting module 510 mounted at one surface of a casing 501, diffused reflection members 530*a* and 530*b* for diffusely reflecting DUV-wavelength light emitted from the light emitting module 510, and a power supply 520 for supplying available power necessary for the light emitting module 510.

The casing 501 is configured to have a rectangular structure. The casing 501 may have an integrated compact structure in which the light emitting module 510, the diffused reflection members 530*a* and 530*b*, and the power supply 520 are mounted. In addition, the casing 501 may be formed of a material suitable for effectively discharging heat generated in the air sterilization apparatus 500 and in a shape suitable for effectively discharging heat generated in the air sterilization apparatus 500. For example, the casing 510 may be formed of any one selected from among Al, Cu, and an alloy thereof. Consequently, efficiency of heat transfer between the casing 501 and external air is increased, thereby improving heat dissipation characteristics of the air sterilization apparatus 500.

Alternatively, the casing 501 may have a unique outer surface shape. For example, the outer surface of the casing 501 may be protruded with having a corrugated, mesh, or non-specific irregular pattern. Consequently, efficiency of heat transfer between the casing 501 and external air is further increased, thereby improving heat dissipation characteristics of the air sterilization apparatus 500.

Meanwhile, an attachment plate 550 may be further disposed at each end of the casing 501. As shown in FIG. 12, the attachment plate 550 means a bracket-function member used to fix the casing 510 to the facilities. The attachment plate 550 may protrude from each end of the casing 501 in a certain direction. The certain direction may be an inward direction of the casing 501 in which DUV is emitted and diffusely reflected.

The attachment plate 550 disposed at each end of the casing 501 provides a fixing area between the casing 501 and the facilities such that the casing 501 can be more effectively fixed to the facilities.

The attachment plate 550 may be implemented by a screw fastening means, a rivet fastening means, a bonding means, or a fitting means. These various coupling means are well known in the art and, therefore, a detailed description thereof will be omitted.

Meanwhile, the light emitting module 510 is disposed at one surface of the casing 510 in a surface mounting fashion. The light emitting module 510 serves to emit DUV for sterilizing microorganisms in air. To this end, the light emitting module 510 includes a board 512 and a plurality of light emitting device packages 100 mounted on the board 512. The light emitting device packages 100 correspond to the light emitting device packages 100A to 100E shown in FIGS. 2 to 4 and 8 to 11.

The board 512 is disposed along the inside of the casing 510 in a single line. The board 512 may be a printed circuit board (PCB) including a circuit pattern (not shown). The board 512 may include a metal core PCB (MCPCB) and a flexible PCB in addition to a general PCB. However, embodiments are not limited thereto.

The diffused reflection members 530*a* and 530*b* are reflective sheet type members for forcibly diffusely reflecting DUV emitted from the light emitting module 510. The diffused reflection members 530*a* and 530*b* may have various front shapes and may be disposed in various forms. The surface structure (e.g. the radius of curvature, etc.) of each of the diffused reflection members 530*a* and 530*b* may be changed step by step to irradiate diffusely reflected DUV in an overlapping fashion such that irradiation intensity of DUV is increased or a width of an area to which DUV is irradiated is increased.

The power supply 520 serves to supply available power necessary for the light emitting module 510. The power supply 520 may be disposed in the casing 501. As shown in FIG. 12, the power supply 520 may be disposed at an inner wall in a space between the diffused reflection members 530*a* and 530*b* and the light emitting module 510. A power connection unit 540 for electric connection between external power and the power supply 520 may be further disposed to introduce the external power to the power supply 520.

As shown in FIG. 12, the power connection unit 540 may be formed in a flat shape. Alternatively, the power connection unit 540 may be formed in the shape of a socket or a cable slot to which an external power cable (not shown) may be electrically connected. The power cable may be flexible such that the power cable is easily connected to the external power.

Figure 13:
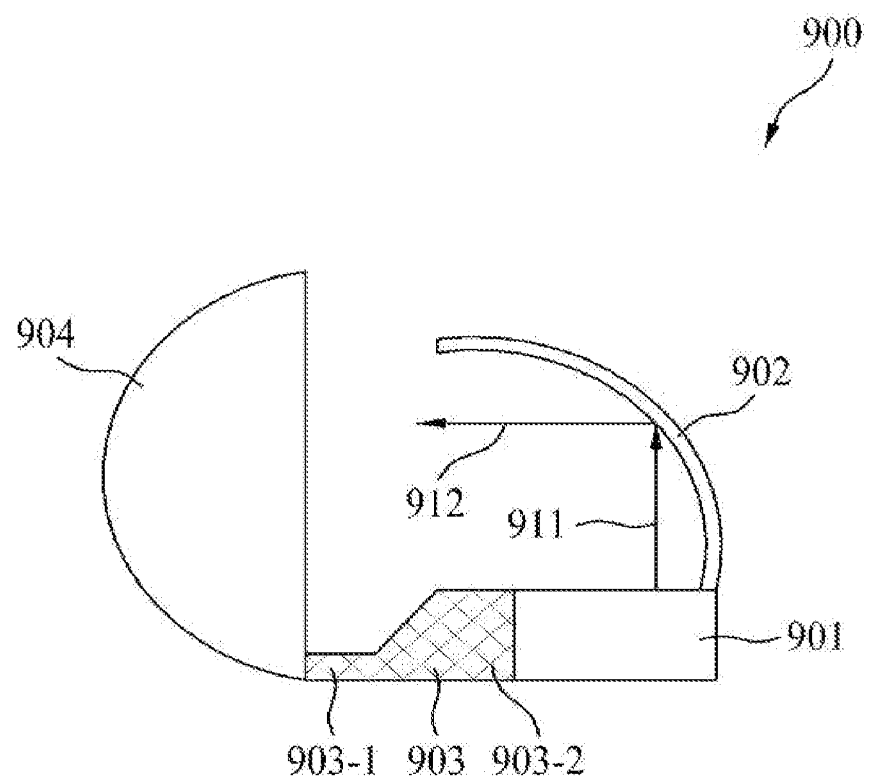
FIG. 13 is a view showing a head lamp including light emitting device packages according to an embodiment.

FIG. 13 is a view showing a head lamp 900 including light emitting device packages according to an embodiment. The head lamp 900 includes a light emitting module 901, a reflector 902, a shade 903, and a lens 904.

The light emitting module 901 may include a plurality of light emitting device packages disposed on a board (not shown). The light emitting device packages may be the light emitting device packages 100A to 100E shown in FIGS. 2 to 4 and 8 to 11.

The reflector 902 reflects light 911 emitted from the light emitting module 901 in a certain direction, e.g. to the front 912. The shade 903 is disposed between the reflector 902 and the lens 904. The shade 903 is a member for blocking or reflecting a portion of light reflected by the reflector 902 and directed to the lens 904 to achieve a light distribution pattern desired by a designer. One side 903-1 and the other side 903-2 of the shade 903 may have different heights.

Light emitted from the light emitting module 901 is reflected by the reflector 902 and the shade 903, is transmitted through the lens 904, and is directed to the front of a vehicle. The lens 904 may refract the light reflected by the reflector 902 to the front.

Figure 14:
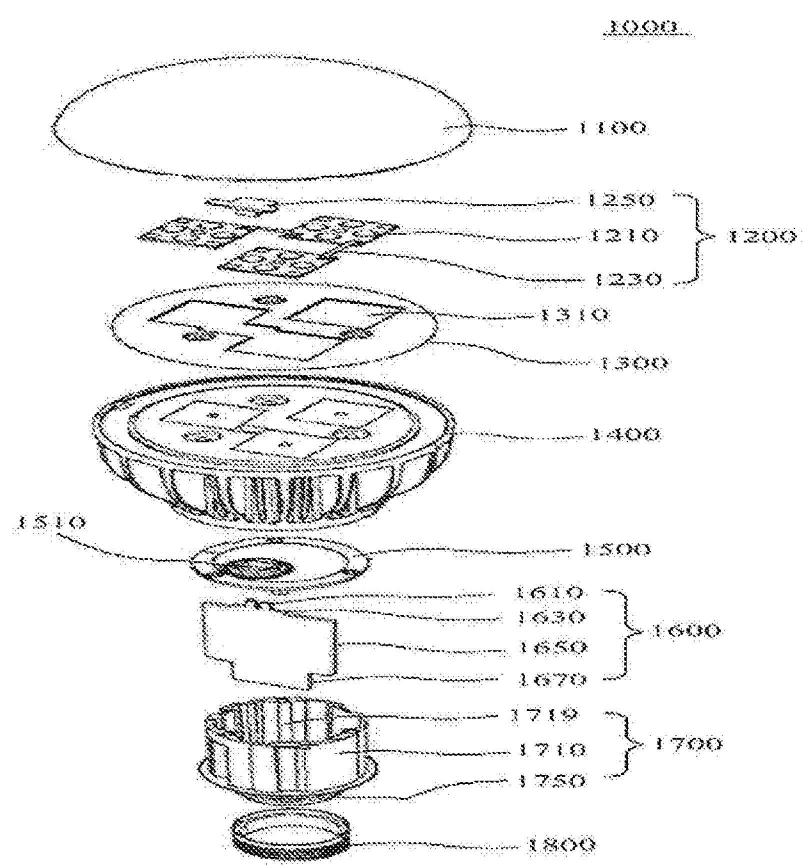
FIG. 14 is a view showing a lighting apparatus including light emitting device packages according to an embodiment.

FIG. 14 is a view showing a lighting apparatus 1000 including light emitting device packages according to an embodiment. The lighting apparatus 1000 may include a cover 1100, a light source module 1200, a heat sink 1400, a power supply 1600, an inner case 1700, and a socket 1800. In addition, the lighting apparatus 1000 may further include at least one selected from between a member 1300 and a holder 1500.

The light source module 1200 may include the light emitting device packages 100A to 100E shown in FIGS. 2 to 4 and 8 to 11 or the light emitting device chips 130A to 130C shown in FIGS. 5A to 5C.

The cover 1100 may be formed in the shape of a bulb or a hemisphere. The cover 1100 may be hollow. A portion of the cover 1100 may be open. The cover 1100 may be optically coupled to the light source module 1200. For example, the cover 1100 may diffuse, scatter, or excite light emitted from the light source module 1200. The cover 1100 may be a kind of optical member. The cover 1100 may be coupled to the heat sink 1400. The cover 1100 may have a coupling part coupled to the heat sink 1400.

The inside of the cover 1100 may be coated with a milky paint. The milky paint may include a diffusion material for diffusing light. The inside of the cover 110 may have surface roughness greater than that of the outside of the cover 1100 such that light emitted from the light source module 1200 can be sufficiently scattered and diffused for exiting outward.

The cover 1100 may be formed of glass, plastic, polypropylene (PP), polyethylene (PE), or polycarbonate (PC). PC exhibits high lightfastness, heat resistance, and strength. The cover 1100 may be transparent such that the light source module 1200 is visible from outside the cover. However, embodiments are not limited thereto. For example, the cover 1100 may be opaque. The cover 1100 may be formed through blow molding.

The light source module 1200 may be disposed at one surface of the heat sink 1400. Consequently, heat generated from the light source module 1200 may be conducted to the heat sink 1400. The light source module 1200 may include light source units 1210, a connection plate 1230, and a connector 1250.

The member 1300 may be disposed on the top of the heat sink 1400. The member 1300 has guide grooves 1310, in which the light source units 1210 and the connector 1250 are inserted. The guide grooves 1310 may correspond to or may be aligned with substrates of the light source units 1210 and the connector 1250.

A light reflective material may be applied to or coated on the surface of the member 1300. For example, a white paint may be applied to or coated on the surface of the member 1300. The member 1300 reflects light reflected by the inside of the cover 1100 and returning to the light source module 1200 such that the light is directed to the cover 1100, thereby improving light efficiency of the lighting apparatus according to the embodiment.

The member 1300 may be formed of an insulative material. The connection plate 1230 of the light source module 1200 may include an electrically conductive material, by which electrical connection between the heat sink 1400 and the connection plate 1230 may be achieved. The member 1300 may be formed of an insulative material for preventing a short circuit between the connection plate 1230 and the heat sink 1400. The heat sink 1400 may dissipate heat generated from the light source module 1200 and heat generated from the power supply 1600.

The holder 1500 blocks a reception groove 1719 of an insulative part 1710 of the inner case 1700. Consequently, the power supply 1600 received in the insulative part 1710 of the inner case 1700 may be hermetically sealed. The holder 1500 may have a guide protrusion 1510. The guide protrusion 1510 may have a hole through which a protrusion 1610 of the power supply 1600 passes.

The power supply 1600 processes or converts an external electrical signal and supplies the processed or converted signal to the light source module 1200. The power supply 1600 may be received in the reception groove 1719 of the inner case 1700 and may be hermetically sealed in the inner case 1700 by the holder 1500. The power supply 1600 may include a guide 1630, a base 1650, and an extension 1670 in addition to the protrusion 1610.

The guide 1630 may be formed in a shape protruding outward from one side of the base 1650. The guide 1630 may be inserted into the holder 1500. A plurality of components may be disposed on one surface of the base 1650. The components may include a direct current converter for converting alternating current power supplied from an external power source into direct current power, a drive chip for controlling driving of the light source module 1200, and an electrostatic discharge (ESD) protection device for protecting the light source module 1200. However, embodiments are not limited thereto.

The extension 1670 may be formed in a shape protruding outward from the other side of the base 1650. The extension 1670 may be inserted into a connection part 1750 of the inner case 1700 and receive an external electrical signal. For example, the extension 1670 may have a width equal to or less than that of the connection part 1750 of the inner case 1700. One end of a positive cable and one end of a negative cable may be electrically connected to the extension 1670 and the other end of the positive cable and the other end of the negative cable may be electrically connected to the socket 1800.

A molding part in addition to the power supply 1600 may be disposed in the inner case 1700. The molding part, which is formed by solidified molding liquid, fixes the power supply 1600 in the inner case 1700.

Embodiments provide a light emitting device package and a lighting apparatus including the package in which light extraction efficiency is improved, a molding member is prevented from being broken, and light exits in all directions.

In one embodiment, a light emitting device package may include a package body; a light emitting device chip disposed on a chip mount area of the package body; and a molding member disposed on the package body, wherein the package body comprises: a central area having the chip mount area and a chip non-mount area adjacent to the chip mount area, the molding member being disposed on the central area; and a peripheral area around the central area, and wherein an upper surface of the light emitting device chip is higher than an upper surface of the package body in the chip non-mount area and than an upper surface of the package body in the peripheral area.

A lower surface of the light emitting device chip may be higher than the upper surface of the package body in the chip non-mount area and than the upper surface of the package body in the peripheral area.

The central area may include a first cavity in which the light emitting device chip is disposed.

The molding member may be disposed to surround the light emitting device chip, and the package body may include at least one molding groove defining a boundary of the molding member.

The at least one molding groove may be disposed in the peripheral area on the package body at an interface between the peripheral area and the central area.

The molding member may be disposed to extend up to an inside edge of the at least one molding groove.

The at least one molding groove may have a circular planar shape.

The molding member is disposed to extend up to an outer edge of the at least one molding groove.

The molding member does not extend beyond an edge of the at least one molding groove.

The light emitting device package may further include a dam disposed on the peripheral area on the package body at an interface between the peripheral area and the central area, the dam defining a second cavity.

A top surface of the dam may be higher than the upper surface of the light emitting device chip.

The dam may include transparent material.

A top surface of the dam may be lower than the upper surface of the light emitting device chip.

The top surface of the dam may be lower than a lower surface of the light emitting device chip.

The molding member may be disposed to extend up to an inner wall of the dam while filling the second cavity.

The molding member may be put on the dam for covering the second cavity.

The molding member may be coupled to the dam by eutectic bonding.

The second cavity may be under vacuum.

The molding member may have a viscosity of less than 3,000 mPa*sec in liquid form prior to hardening.

In another embodiment, a lighting apparatus may include a light source module including a light emitting device package; and a cover optically coupled to the light source module, wherein the light emitting device package may include a package body; a light emitting device chip disposed on a chip mount area of the package body; and a molding member disposed on the package body, wherein the package body may include a central area having the chip mount area and a chip non-mount area adjacent to the chip mount area, the molding member being disposed on the central area; and a peripheral area around the central area, and wherein an upper surface of the light emitting device chip is higher than an upper surface of the package body in the chip non-mount area and than an upper surface of the package body in the peripheral area.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:

a package body having a central area and a peripheral area adjacent to the central area, the central area including a chip mount area and a chip non-mount area adjacent to the chip mount area;

a light emitting device chip provided on the chip mount area of the package body; and a molding member provided on the central area of the package body, wherein an upper surface of the light emitting device chip is higher than an upper surface of the package body in the chip non-mount area and an upper surface of the package body in the peripheral area, wherein the upper surface of the package body in the chip non-mount area includes an upper edge surface in an edge of the chip non-mount area, the upper edge surface contacting the molding member, and wherein a lower surface of the light emitting device chip is higher than the upper edge surface of the package body.

2. The light emitting device package according to claim 1, wherein the lower surface of the light emitting device chip is higher than the upper surface of the package body in the peripheral area.

3. The light emitting device package according to claim 1, wherein the central area comprises a first cavity in which the light emitting device chip is disposed.

4. The light emitting device package according to claim 1, wherein the molding member is provided to surround the light emitting device chip, and the package body includes at least one molding groove defining a boundary of the molding member.

5. The light emitting device package according to claim 4, wherein the at least one molding groove is disposed in the peripheral area on the package body between the peripheral area and the central area.

6. The light emitting device package according to claim 4, wherein the molding member is disposed to extend up to an inside edge of the at least one molding groove.

7. The light emitting device package according to claim 4, wherein the at least one molding groove has a circular planar shape.

8. The light emitting device package according to claim 4, wherein the molding member is disposed to extend up to an outer edge of the at least one molding groove.

9. The light emitting device package according to claim 4, wherein the molding member does not extend beyond an edge of the at least one molding groove.

10. The light emitting device package according to claim 1, further comprising a dam disposed on the peripheral area on the package body between the peripheral area and the central area, the dam defining a second cavity.

11. The light emitting device package according to claim 10, wherein a top surface of the dam is higher than the upper surface of the light emitting device chip.

12. The light emitting device package according to claim 11, wherein the dam comprises a transparent material.

13. The light emitting device package according to claim 10, wherein a top surface of the dam is lower than the upper surface of the light emitting device chip.

14. The light emitting device package according to claim 13, wherein the top surface of the dam is lower than a lower surface of the light emitting device chip.

15. The light emitting device package according to claim 10, wherein the molding member is provided to extend up to an inner wall of the dam while filling the second cavity.

16. The light emitting device package according to claim 11, wherein the molding member is provided on the dam for covering the second cavity.

17. The light emitting device package according to claim 16, wherein the molding member is coupled to the dam by eutectic bonding.

18. The light emitting device package according to claim 16, wherein the second cavity is under vacuum.

19. The light emitting device package according to claim 1, wherein the molding member has a viscosity of less than 3,000 mPa*sec in liquid form prior to hardening.

20. A lighting apparatus, comprising:

a light source module including a light emitting device package; and a cover optically coupled to the light source module, wherein the light emitting device package comprises:

a package body having a central area and a peripheral area adjacent to the central area, the central area including a chip mount area and a chip non-mount area adjacent to the chip mount area;

a light emitting device chip provided on the chip mount area of the package body; and a molding member provided on the central area of the package body, wherein an upper surface of the light emitting device chip is higher than an upper surface of the package body in the chip non-mount area and an upper surface of the package body in the peripheral area, wherein the upper surface of the package body in the chip non-mount area includes an upper edge surface in an edge of the chip non-mount are, the upper edge surface contacting the molding member, and wherein a lower surface of the light emitting device chip is higher than the upper edge surface of the package body.

* * * * *